United States Patent
Yang et al.

(10) Patent No.: US 9,529,064 B2
(45) Date of Patent: Dec. 27, 2016

(54) BROAD BANDWIDTH MAGNETIC RESONANCE SPECTROSCOPY AT HIGH STATIC (B0) MAGNETIC FIELD USING POLARIZATION TRANSFER

(75) Inventors: Baolian Yang, Highland Heights, OH (US); David Leslie Foxall, Mentor, OH (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 699 days.

(21) Appl. No.: 13/984,910

(22) PCT Filed: Jan. 10, 2012

(86) PCT No.: PCT/IB2012/050118
§ 371 (c)(1),
(2), (4) Date: Aug. 12, 2013

(87) PCT Pub. No.: WO2012/110901
PCT Pub. Date: Aug. 23, 2012

(65) Prior Publication Data
US 2013/0314087 A1   Nov. 28, 2013

Related U.S. Application Data

(60) Provisional application No. 61/442,833, filed on Feb. 15, 2011.

(51) Int. Cl.
*G01R 33/32* (2006.01)
*G01R 33/46* (2006.01)
(Continued)

(52) U.S. Cl.
CPC ........... *G01R 33/32* (2013.01); *G01R 33/4608* (2013.01); *G01R 33/4616* (2013.01); *G01R 33/483* (2013.01); *G01R 33/485* (2013.01)

(58) Field of Classification Search
CPC . G01R 33/32; G01R 33/4608; G01R 33/4616; G01R 33/483; G01R 33/485
See application file for complete search history.

(56) References Cited

U.S. PATENT DOCUMENTS

| 4,521,732 A | 6/1985 | Pegg |
| 4,987,369 A | 1/1991 | Van Stapele |

(Continued)

OTHER PUBLICATIONS

Li, Shizhe et al "In vivo Single-Shot, Proton-Localized C MRS of Rhesus Monkey Brain", NMR in Biomedicine, 2005, vol. 18, pp. 560-569.

(Continued)

*Primary Examiner* — G. M. Hyder

(57) ABSTRACT

A magnetic resonance (MR) generating a static (BO) magnetic field of 5 Tesla or higher controller is configured to control an MR scanner to perform an MR sequence (14) including: performing an excitation/localization sub-sequence (30) on a subject disposed in the static (BO) magnetic field generated by the MR scanner to excite 1H polarization in a selected spatial region of the subject; performing 5 a polarization transfer sub-sequence (32) to transfer localized 1H polarization generated by the excitation/localization sub-sequence to a selected species of non-proton nuclei; and performing a magnetic resonance spectroscopy (MRS) readout sub-sequence (40) to acquire MRS data for the selected species of non-proton nuclei in the selected spatial region of the subject. The polarization transfer sub-sequence includes a pair of phase 10 distortion canceling trapezoidal 180° refocusing pulses (36, 37) operating on the selected species of non-proton nuclei.

21 Claims, 3 Drawing Sheets

Figure 1:
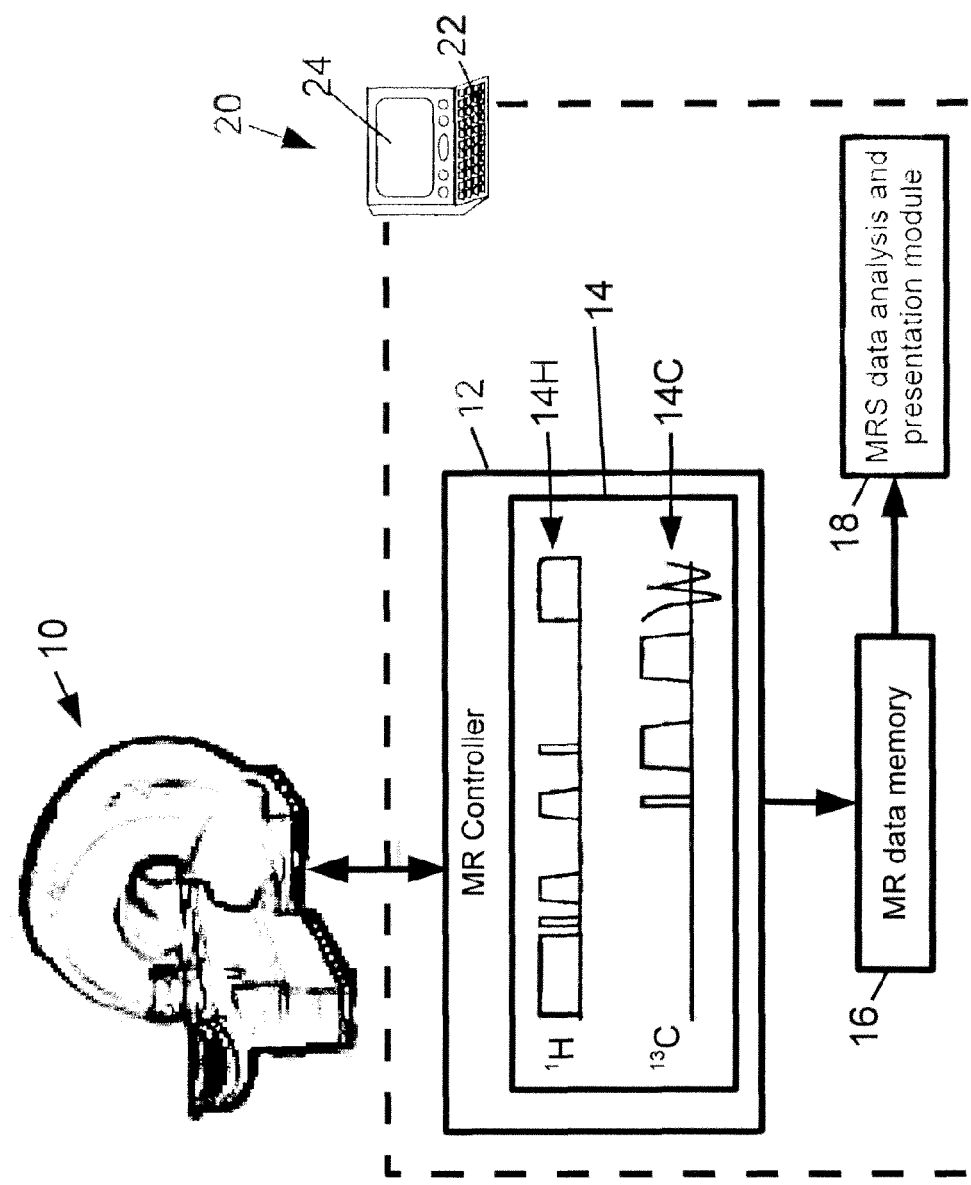

(51) Int. Cl.
G01R 33/483 (2006.01)
G01R 33/485 (2006.01)

(56) References Cited

U.S. PATENT DOCUMENTS

| 7,535,223 | B2 | 5/2009 | Klomp |
| 7,772,844 | B2 | 8/2010 | Hurd |
| 2007/0052416 | A1 | 3/2007 | Bottcher |
| 2007/0247152 | A1* | 10/2007 | Klomp ............... G01R 33/4608 324/307 |

OTHER PUBLICATIONS

Kupce, Eriks et al "Compensated Adiabatic Inversion Pulses: Broadband INEPT and HSQC" Sciencedirect, Journal of Magnetic Resonance, vol. 187, 2007, pp. 258-265.

Klomp, D.W.J. et al "Polarization Transfer for Sensitivity-Enhanced MRS using a Single Radio Frequency Transmit Channel", NMR in Biomedicine, vol. 21, 2008, pp. 441-452.

Hwang, Tsang-Lin et al "Broadband Adiabatic Refocusing without Phase Distortion" Journal of Magnetic Resonance, vol. 124, 1997, pp. 250-254.

Conolly, Steven et al "A Reduced Power Selective Adiabatic Spin-Echo Pulse Sequence" Magnetic Resonance in Medicine, vol. 18, 1991, pp. 28-38.

Xu, Su et al "In vivo Dynamic Turnover of Cerebral C Isotopomers from U-C Glucose", Sciencedirect, Journal of Magnetic Resonance, vol. 182, 2006, pp. 221-228.

Slotboom, J. et al "Adiabatic Slice-Selective rf Pulses and a Single-Shote Adiabatic Localization Pulse Sequence", Concepts in Magnetic Resonance, vol. 7, No. 3, 1995, pp. 193-217.

Watanabe, H. et al "In Vivo 3D Localized C Spectroscopy using Modified INEPT and DEPT", Journal of Mangetic Resonance, vol. 134, 1998, pp. 214-222.

Coxon, Bruce "Two Dimensional Pommie Carbon-Proton Chemical Shift Correlated C NMR Spectrum Editing", Center for Analytical Chemistry, vol. 68, 1990, pp. 1145-1150.

Koskela, Harri, "Some Aspects of Polarisation Transfer in NMR Spectroscopy", OULU 2005.

* cited by examiner

BROAD BANDWIDTH MAGNETIC RESONANCE SPECTROSCOPY AT HIGH STATIC (B0) MAGNETIC FIELD USING POLARIZATION TRANSFER

CROSS-REFERENCE TO PRIOR APPLICATIONS

This application is the U.S. National Phase application under 35 U.S.C. §371 of International Application No. PCT/IB2012/050118, filed on Jan. 10, 2012, which claims the benefit of U.S. Provisional Patent Application No. 61/442,833, filed on Feb. 15, 2011. These applications are hereby incorporated by reference herein.

DESCRIPTION

The following relates to the magnetic resonance arts, magnetic resonance spectroscopy arts, magnetic resonance imaging arts, medical imaging arts, and related arts.

Magnetic resonance (MR) is a known technique that is useful in medical diagnostics, veterinary work, forensic sciences, archaeology, and so forth. Most commonly, an MR image is generated by exciting, spatially encoding, and reading out the $^1$H magnetic resonance signal. More information can be obtained by magnetic resonance spectroscopy (MRS), in which the spectrum of the MR response is acquired and analyzed. For medical or veterinary applications it is desirable to perform localized in vivo MRS, in which the MRS signal is localized to a single voxel (SV MRS) or is spatially encoded into a two- or three-dimensional grid of voxels (magnetic resonance spectroscopic imaging or MRSI). Moreover, while some MRS applications probe the $^1$H spectrum, probing other nuclei also can elucidate useful information. For example, $^{13}$C MRS provides large chemical shift dispersion and is useful for probing localized biological metabolism.

However, it is difficult to obtain a localized in vivo $^{13}$C spectrum. The broad chemical shift distribution of $^{13}$C nucleus corresponds to a spectrally broad $^{13}$C MRS spectrum, which in turn calls for a broadband excitation pulse. This problem increases at higher B0 magnetic field. For example, in the case of a 7 Tesla B0 field the excitation pulse should have a bandwidth of 16 kHz. The total radio frequency (RF) power for such an excitation is difficult to generate and can raise safety issues, such as potentially exceeding applicable specific absorption rate (SAR) limits.

Another difficulty with localized in vivo $^{13}$C MRS is that it calls for using high magnetic field gradient strength to select usefully "thin" slices or sufficiently localized single voxels or grid voxels. This problem interrelates with the broad chemical shift distribution and requisite broadband excitation to cause different slice localization for different portions of the broad $^{13}$C spectrum. This difficulty in obtaining spatial localization with high resolution is increased by the low gyrometric ratio of $^{13}$C nuclei which reduces the effectiveness of magnetic field gradients for spatial localization.

Yet another difficulty with localized in vivo $^{13}$C MRS is phase distortion of $^{13}$C MRS spectrum caused by adiabatic RF pulses. At high B0 field, adiabatic excitation pulses in which both amplitude and phase are modulated are used to provide robustness against B1 field variation and frequency offset. Adiabatic RF pulse excitation is particularly useful for $^{13}$C MRS since it provides robustness against the large bandwidth of the $^{13}$C spectrum. However, the use of adiabatic RF pulse excitation leads to phase distortion which complicates data processing and analysis.

In view of these difficulties, the use of $^1$H→$^{13}$C polarization transfer has been proposed for $^{13}$C MRS. See Klomp et al., "Polarization transfer for sensitivity-enhanced MRS using a single radio frequency transmit channel", NMR Biomed. vol. 21 pp. 444-452 (2007). This approach excites and spatially localizes $^1$H magnetic resonance and then employs J-coupling to transfer the spatially localized $^1$H polarization to $^{13}$C nuclei. The MR pulse sequence includes spatial localization by image-selected in vivo spectroscopy (ISIS) operating on the $^1$H spins, followed by $^1$H→$^{13}$C polarization transfer by distortionless enhancement of polarization transfer (DEPT). In the DEPT portion of the sequence, adiabatic or "semi-adiabatic" BIR4 pulses were used for $^{13}$C nuclei manipulation. Klomp et al. report results at a B0 field of 3 Tesla.

The following provides new and improved apparatuses and methods as disclosed herein.

In accordance with one disclosed aspect, a method comprises performing a magnetic resonance (MR) sequence including: performing an excitation/localization sub-sequence on a subject to excite $^1$H polarization localized in a selected spatial region of the subject; performing a polarization transfer sub-sequence to transfer localized $^1$H polarization generated by the excitation/localization sub-sequence to a selected species of non-proton nuclei wherein the polarization transfer sub-sequence includes a pair of phase distortion canceling 180° refocusing pulses operating on the selected species of non-proton nuclei, and performing a magnetic resonance spectroscopy (MRS) readout sub-sequence to acquire MRS data for the selected species of non-proton nuclei in the selected spatial region of the subject.

In accordance with another disclosed aspect, an apparatus comprises a magnetic resonance (MR) scanner generating a static (B0) magnetic field of 5 Tesla or higher, and an MR controller configured to control the MR scanner to perform an MR sequence including: performing an excitation/localization sub-sequence on a subject disposed in the static (B0) magnetic field generated by the MR scanner to excite $^1$H polarization in a selected spatial region of the subject; performing a polarization transfer sub-sequence to transfer localized $^1$H polarization generated by the excitation/localization sub-sequence to a selected species of non-proton nuclei; and performing a magnetic resonance spectroscopy (MRS) readout sub-sequence to acquire MRS data for the selected species of non-proton nuclei in the selected spatial region of the subject.

In accordance with another disclosed aspect, a storage medium stores instructions executable by a processor to control a magnetic resonance (MR) scanner to perform an MR sequence including: performing an excitation/localization sub-sequence on a subject to excite $^1$H polarization localized in a selected spatial region of the subject; performing a polarization transfer sub-sequence to transfer localized $^1$H polarization generated by the excitation/localization sub-sequence to a selected species of non-proton nuclei wherein the polarization transfer sub-sequence includes at least one trapezoidal 180° refocusing pulse operating on the selected species of non-proton nuclei; and performing a magnetic resonance spectroscopy (MRS) readout sub-sequence to acquire MRS data for the selected species of non proton nuclei in the selected spatial region of the subject.

One advantage resides in providing $^{13}$C or other non-proton MRS at high magnetic field (e.g., B0=5 Tesla or higher, or B0=7 Tesla or higher).

Another advantage resides in providing $^{13}$C or other non-proton MRS by polarization transfer with improved spectral bandwidth.

Another advantage resides in providing $^{13}$C or other non-proton MRS by polarization transfer with reduced phase distortion.

Further advantages will be apparent to those of ordinary skill in the art upon reading and understanding the following detailed description.

FIG. 1 diagrammatically shows a magnetic resonance (MR) system configured to perform magnetic resonance spectroscopy (MRS) as disclosed herein.

Figure 2:
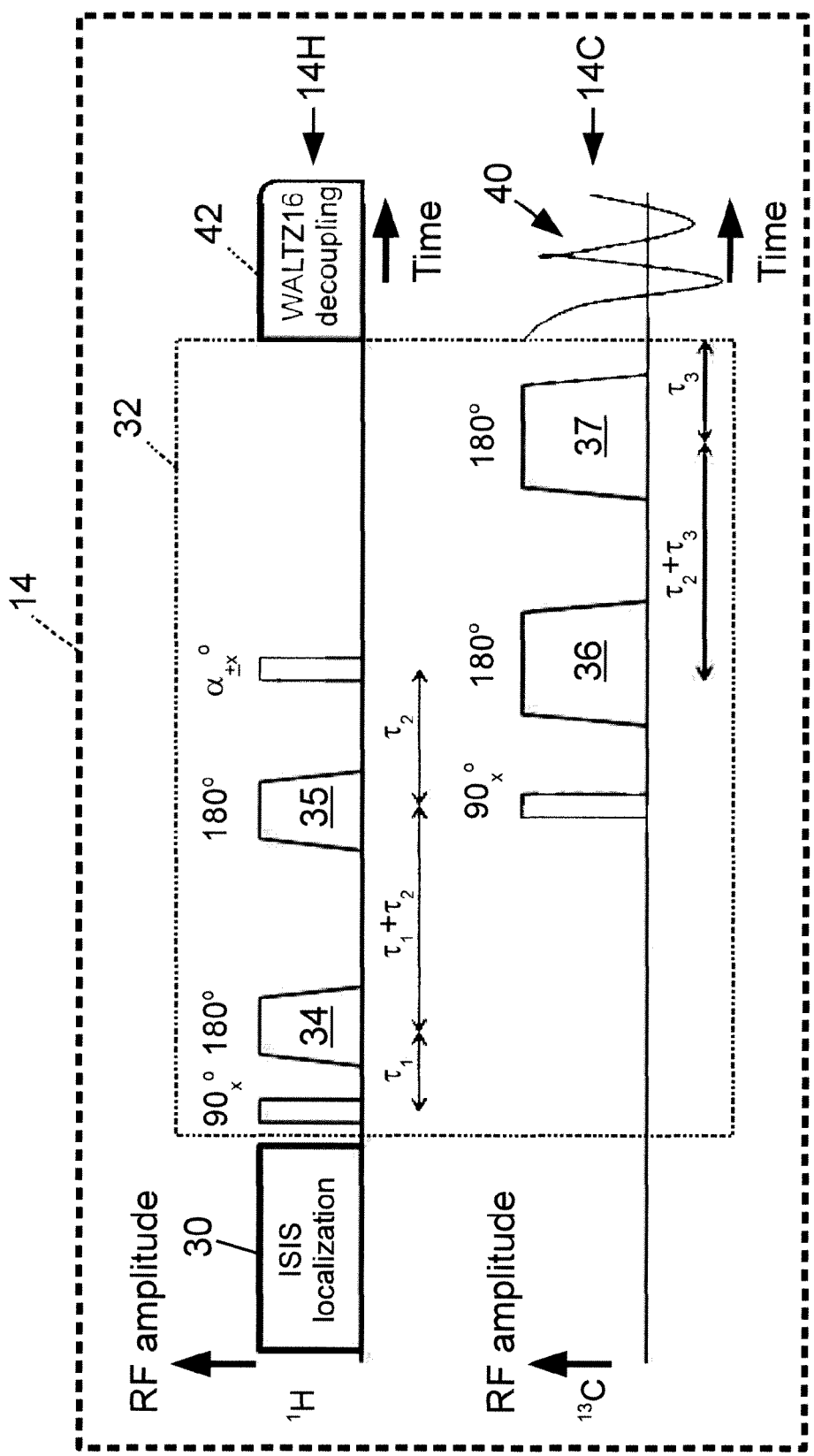

FIG. 2 diagrammatically shows a pulse sequence diagram for the MRS acquisition sequence employed by the MR system of FIG. 1.

Figures 3, 4:
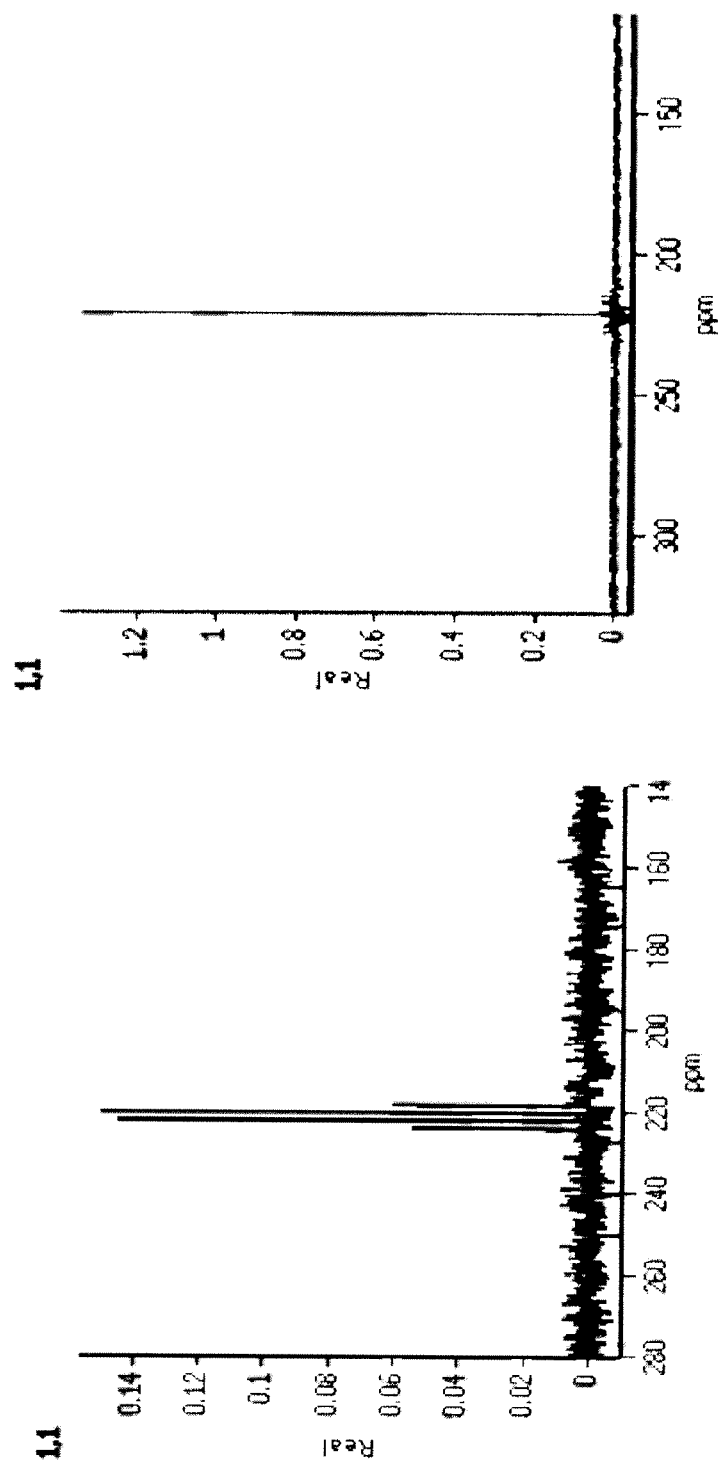

FIGS. 3 and 4 plot $^{13}$C MRS spectra acquired without broadband decoupling (FIG. 3) and with broadband decoupling (FIG. 4).

With reference to FIG. 1, a magnetic resonance system includes a magnetic resonance (MR) scanner 10, such as an illustrated Achieva™ MR scanner (available from Koninklijke Philips Electronics N. V., Eindhoven, The Netherlands), or an Intera™ or Panorama™ MR scanner (both also available from Koninklijke Philips Electronics N.V.), or another commercially available MR scanner, or a non-commercial MR scanner, or so forth. In a typical embodiment, the MR scanner includes internal components (not illustrated) such as a superconducting or resistive main magnet generating a static ($B_0$) magnetic field, sets of magnetic field gradient coil windings for superimposing selected magnetic field gradients on the static magnetic field, a radio frequency excitation system for generating a radio frequency ($B_1$) field at a frequency selected to excite magnetic resonance (typically $^1$H magnetic resonance, although excitation of another magnetic resonance nuclei or of multiple magnetic resonance nuclei is also contemplated), and a radio frequency receive system including a radio frequency receive coil array, or a plurality of receive coils, for detecting magnetic resonance signals emitted from the subject.

With continuing reference to FIG. 1, the MR scanner 10 operates under control of a magnetic resonance (MR) control module 12 to perform magnetic resonance spectroscopy (MRS) using an MR pulse sequence 14 that operates by exciting and localizing $^1$H polarization and then transferring at least a portion of that polarization to $^{13}$C nuclei. The MR pulse sequence 14 includes a proton portion 14H that manipulates $^1$H nuclei and a carbon portion 14C that manipulates $^{13}$C nuclei. The MR pulse sequence 14 is similar to that of Klomp et al., "Polarization transfer for sensitivity-enhanced MRS using a single radio frequency transmit channel", NMR Biomed. vol. 21 pp. 444-452 (2007) (hereinafter "Klomp") which is incorporated herein by reference in its entirety, and operates on the basis of excitation and spatial localization of $^1$H nuclei by the proton portion 14H followed by $^1$H→$^{13}$C polarization transfer by an operative combination of the proton and carbon portions 14H, 14C. However, as disclosed herein, the Klomp MR pulse sequence has certain deficiencies that reduce or obviate entirely its effectiveness at higher magnetic field, e.g. at B0>3 Tesla. The MR pulse sequence 14 disclosed herein, on the other hand, is capable of operating effectively at higher magnetic field, e.g. at B0=5 Tesla or B0=7 Tesla. The MR pulse sequence 14 is suitably used for MR spectroscopic imaging (MRSI) or for single voxel (SV) acquisition.

An MR data memory 16 accumulates data acquired by the MR pulse sequence 14. An MRS data analysis and presentation module 18 processes the MRS data to produce useful information. For example, the MRS data analysis and presentation module 18 suitably plots the acquired $^{13}$C spectrum for a voxel as a function of frequency (or wavenumber or another spectral metric), or displays an image whose pixel or voxel intensities correspond to a peak value of an MRS spectrum peak of interest, or plots the peak value of an MRS spectrum peak of interest for a single voxel over time so as to extract functional information, or so forth.

The various computational and memory components 12, 16, 18 are suitably embodied by an illustrative computer 20 or other digital processing device employing a multi-core processor or other parallel processor, a single-core processor, a graphical processing unit, i.e. GPU, or so forth and having a communication bus or other operative connection with the MR scanner 10 to cause the MR scanner 10 to perform the MRS data acquisition including applying the MR pulse sequence 14. While the digital processing device employs a digital processor, it is also contemplated for the digital processing device to include or have access to some analog circuitry, such as analog or hybrid digital/analog application-specific integrated circuitry (ASIC). The disclosed MRS techniques may also be embodied as a storage medium storing instructions that when executed by a processor of the digital processing device 20 perform the disclosed operations. For example, the storage medium may comprise a hard drive, optical drive, random access memory (RAM), FLASH memory, or other electrostatic memory, various combinations thereof, or another suitable storage medium. These types of storage media may also be used as the MR data memory 16. Indeed, in some embodiments a common storage medium (e.g., a hard disk drive of the computer) may both embody the MR data memory 16 and also store the instructions that when executed by a processor of the digital processing device 20 perform the disclosed operations. The MR system typically also includes an illustrative keyboard 22 or other user input device (e.g., a mouse, trackball, or other pointing device) via which a user inputs commands, parameters, or so forth for initiating and controlling the MRS acquisition, data processing, and/or data presentation. MRS spectra, MRSI images, or other MRS data presentation output by the MRS data analysis and presentation module 18 are suitably displayed on a display device such as an illustrative display device 24 of the illustrative computer 20. Although the various processing components 12, 18, data memory 16, and user interfacing components 22, 24 are illustrated as integrated or combined into the single illustrative computer 20, it is to be understood that these various components and/or memory may instead be variously embodied by different computers, network servers, Internet-based processors, components of a cloud computing network, or so forth.

The MR pulse sequence 14 is shown as integrated with the MR controller 12. For example, the MR pulse sequence 14 may be stored in a memory or storage medium of the MR controller 12. In an alternative approach, the MRS pulse sequence 14 may be stored on a storage medium that is distinct from, but in operative communication with, the MR controller 12. The MRS pulse sequence 14 may be stored as instructions executed by the MR controller 12, or as data that is operated upon by the MR controller 12. As an example of the latter, each pulse may be represented in the MRS pulse sequence 14 by a source (e.g., radio frequency coil, magnetic field gradient coil, or other generator) and pulse parameters such as pulse amplitude, duration, frequency, or so forth.

With reference to FIG. 2, the illustrative MR pulse sequence 14 is shown in an enlarged view with additional labeling. It is to be understood that FIG. 2 shows a diagrammatic representation of the MRS pulse sequence 14 including salient features described herein. The MRS pulse sequence 14 may include additional or other pulses that are not illustrated in FIG. 2. For example, when used in an MRSI acquisition the MRS pulse sequence 14 typically includes suitable spatial encoding magnetic field gradient pulses that are not shown in FIG. 2.

The MR pulse sequence 14 includes the following components. A $^1$H excitation/localization sub-sequence 30 is applied to excite and localize $^1$H magnetic resonance. Following the approach of Klomp, the $^1$H excitation/localization sub-sequence 30 in the illustrative example includes spatial localization by image-selected in vivo spectroscopy (ISIS); however, other excitation and spatial localization pulse (sub-)sequences may be employed. In diagrammatic FIG. 2 the $^1$H excitation/localization sub-sequence 30 is shown as a diagrammatic box on the RF amplitude-time plot; however, it is to be understood that the $^1$H excitation/localization sub-sequence 30 may include various spatial gradients for providing spatial localization.

The $^1$H excitation/localization sub-sequence 30 is followed by a $^1$H→X polarization transfer sub-sequence 32. In this notation, the symbol "X" denotes a target non-proton isotope to which the $^1$H polarization is transferred via J-coupling by the polarization transfer sub-sequence 32. In the illustrative embodiments, "X" is the $^{13}$C isotope; however, in other embodiments "X" may be another species of non-proton nuclei such as $^{15}$N, $^{31}$P, or so forth. The illustrative example in which X=$^{13}$C is of substantial medical and veterinary interest insofar as $^{13}$C MRS can provide metabolic information pertaining to brain, muscle, liver, or other in vivo tissue of interest.

Again following Klomp, the illustrative polarization transfer sub-sequence 32 employs distortionless enhancement of polarization transfer (DEPT). However, the polarization transfer sub-sequence 32 includes certain improvements disclosed herein. In the Klomp DEPT sequence, adiabatic or "semi-adiabatic" BIR4 pulses were used for $^{13}$C nuclei manipulation. Such pulses are reported in Klomp to provide satisfactory performance at 3 Tesla. However, as disclosed herein Bloch simulations of these BIR4 pulses indicate that they provide a constant flip angle over only about ±2 kHz (i.e., about 4 kHz bandwidth). In contrast, at a 7 Tesla B0 magnetic field the $^{13}$C spectrum has a bandwidth of about 16 kHz. It is recognized herein that the bandwidth limitation of BIR4 pulses is a consequence of phase distortion, which prevents the BIR4 pulses from providing uniform flip angle for bandwidths greater than about 4 kHz.

As disclosed herein, the phase distortion problem can be overcome by splitting the 180° refocusing pulse into two refocusing pulses for which the phase distortion cancels. Accordingly, the illustrative polarization sub-sequence 32 includes two 180° refocusing pulses 34, 35 in the proton portion 14H and two 180° refocusing pulses 36, 37 in the carbon portion 14C (or, more generally, in the non-proton "X" portion).

In addition to providing phase distortion cancellation, the refocusing pulses 34, 35, 36, 37 are also designed to be adiabatic and to provide a constant flip angle over a large bandwidth, e.g. 16 kHz in some embodiments. In contrast to the complex shape of BIR4 pulses, these adiabatic and wide bandwidth performance objectives are achieved with paired refocusing pulses 34, 35, 36, 37 of a simple trapezoidal shape. Suitable design of the refocusing pulses 34, 35, 36, 37 as Offset Independent Trapezoid (OIT) adiabatic inversion pulses is as follows.

In the design of the refocusing pulses 34, 35, 36, 37, frequency modulation is employed to create adiabatic spin inversion. A convenient description of this process uses a second rotating frame whose frequency matches the instantaneous RF frequency during the pulse. In this frame the magnetization vector starts out along the +Z axis and remains spin locked to the instantaneous applied field created by modulation of the RF amplitude and the RF frequency. Sweeping the RF frequency from some value +$\omega_0$ to −$\omega_0$ while modulating the RF amplitude from 0→$\omega_1$→0 will create spin inversion over some of the frequency region in the range −$\omega_0$≤Ω≤+$\omega_0$ provided the modulation is performed slowly enough to allow magnetization to remain spin-locked along the effect field $\omega_e$. If α is the angle that $\omega_e$ makes to the +Z axis, then the following condition ensures that spin locking is maintained for a group of spins with resonant frequency Ω:

$$\left| \left( \frac{1}{\omega_e} \right) \frac{d\alpha}{dt} \right| = \frac{\left| \omega_1 F_1(t)\omega_o \frac{dF_2}{dt} - \omega_1 \frac{dF_1}{dt}(\omega_o F_2(t) - \Omega) \right|}{\omega_e^3} \ll 1$$

where:

$$\omega_e = \sqrt{\omega_1^2 F_1^2(t) + (\omega_o F_2(t) - \Omega)^2}$$

The functions $F_1(t)$ and $F_2(t)$ describe the normalized time dependence of the amplitude and frequency modulation applied during the pulse interval. The relationship between $F_1(t)$ and $F_2(t)$ to perform full spin inversion over a well defined range of frequencies: −$\omega_0$≤Ω≤+$\omega_0$ for an arbitrary RF amplitude modulation $F_1(t)$ are (see, e.g. Tannus et al., J. Magn. Reson, 120, 133-137 (1996)):

$$F_2(t) = 1 - 2 \left[ \frac{\int_0^t F_1^2(u) du}{\int_0^T F_1^2(u) du} \right]$$

Spin inversion covering a wide frequency sweep ($\omega_0$) with a low maximum RF field strength ($\omega_1$) is provided by applying a constant RF field while sweeping the frequency from +$\omega_0$ to −$\omega_0$ (i.e., a linear chirp). This approach can cover almost any desired range resonance offset (Ω). Moreover, if the design is limited by the strength of the RF field ($\omega_1$), then this method can be an efficient way to perform such an inversion. The linear sweep method is not slice-selective, because increasing values of Ω cause the adiabatic condition to fail at the ends of the sweep. OIT pulses avoid this problem by allowing the RF amplitude to be ramped up before the linear frequency sweep starts, and ramped down after the linear sweep ends. The adiabatic condition is maintained during both the RF ramping and frequency sweeping operations. In the center interval of the OIT pulse (Tc) the RF amplitude is constant ($F_1(t)$=1) and at some point in the interval the function: ($\omega_o F_2(t) - \Omega$)=0. For a linear frequency sweep the spin lock condition reduces to:

$$\left(\frac{\omega_o}{\omega_1^2}\right)\left(\frac{2}{Tc}\right) \ll 1$$

At this point for spins resonating at Ω, the strength of the spin locking field has fallen to its minimum value: $\Omega_e = \Omega_1$. If the maximum frequency sweep rate is selected, then the spin lock condition becomes an equality at this point, and the central interval for the trapezoid inversion pulse can be chosen to be:

$$Tc \geq \frac{\omega_o}{2\omega_1^2}$$

At the start of the RF pulse the RF frequency is held constant, while the RF amplitude is ramped up over the interval (Tr). The spin lock condition becomes:

$$\frac{\omega_1}{Tr(\omega_o - \Omega)^2} \ll 1$$

It is desired for the pulse to uniformly invert signal over the region: $-\omega_0 + \overline{\omega} \leq \Omega \leq +\omega_0 - \overline{\omega}$, where $\overline{\omega}$ represents the frequency width of the transition zone for the slice profile. The spin lock condition becomes critical when:

$$\Omega = \omega_o - \overline{\omega}$$

Choosing the width of the slice transition zone to be proportional to the maximum RF amplitude:

$$\overline{\omega} = k\omega_1$$

The spin lock condition can be simplified, and the ramping interval chosen to be:

$$Tr = \frac{1}{k^2 \omega_1}$$

The value of k chosen for OIT pulses is √2. Knowledge of the intervals Tr and Tc now allow construction of the functions $F_1(t)$ and $F_2(t)$ directly so as to completely define the OIT pulse. Using such a design approach, the pair of phase distortion canceling 180° refocusing pulses 36, 37 operating on the $^{13}C$ (or, more generally, species X of non-proton nuclei) can be designed to provide a constant flip angle over a band width of at least 10 kHz, and more preferably over a band width of 16 kHz in the case of $^{13}C$ nuclei.

While the 180° refocusing pulses 34, 35, 36, 37 are OIT pulses as just described, the 90° and α° excitation pulses for $^1H$ and $^{13}C$ are suitably block RF pulses.

The illustrative polarization transfer sub-sequence 32 employs DEPT. However, other polarization transfer approaches can be used, such as insensitive nuclei enhanced by polarization transfer (INEPT), again incorporating paired OIT pulses to provide adiabatic and wide bandwidth performance.

Subsequent to the polarization transfer sub-sequence 32, the carbon portion 14C of the MR pulse sequence 14 includes a magnetic resonance spectroscopy (MRS) readout sub-sequence 40. Optionally, the proton portion 14H of the MR pulse sequence 14 may include a $^1H$-$^{13}C$ decoupling (or, more generally, $^1H$-X decoupling) sub-sequence 42 applied concurrently with the readout sub-sequence 40 to decouple proton resonance from the $^{13}C$ (or, more generally, X) magnetic resonance. In some embodiments the $^1H$-$^{13}C$ decoupling sub-sequence 42 is a WALTZ16 sequence.

$^{13}C$ MRS has been performed using the MR pulse sequence 14. The $^{13}C$ MRS was performed with a Philips 7T whole body MR scanner having a maximum magnetic field gradient strength of 40 mT/m and slew rate of 200 mT/m/sec, two wideband RM amplifiers with maximum RF output of 4 kW, a dual-tune $^1H/^{13}C$ partial volume coil (generating a $B_1$ field for $^1H$ excitation of 20 μT, and a $B_1$ field for $^{13}C$ excitation of 186 μT). Parameters for carbon portion 14C are as follows: the 90° pulse length is 0.128 ms, and the excitation bandwidth is 7812 Hz; 180° OIT pulse has a length of 4.9 ms and a bandwidth of 21777 Hz. Parameters for proton portion 14H are as follows: the 90° pulse length is 0.326 ms, and the excitation bandwidth is 3063 Hz; 180° OIT pulse has a length of 4.2 ms and a bandwidth of 272 5 Hz. The delay times $\tau_1$, $\tau_2$, $\tau_3$ indicated for the MR pulse sequence 14 in FIG. 2 are 2.8 ms, 3.75 ms and 2.75 ms respectively. Other scan parameters used in the MR pulse sequence 14 include a TR of 10 sec, TE of 13 msec, 16 kHz acquisition bandwidth and 1024 data points. The WALTZ16 pulse train 42 was used for $^1H$ decoupling and the $B_1$ value was 18 μT with 100% duty cycle.

FIG. 3 shows the result of a phantom (Philips 7T Carbon SNR phantom comprising 800 mL H2O, 3.0 g/L NaL, 100 mL DMSO 100 mL D6-Acetone) scan with proton ISIS and dual-echo DEPT. The signal enhancement was about 2 and only zero-order phase correction was used. The signal of $CD_3$ is total removed by phase cycling.

FIG. 4 shows a result analogous to FIG. 3 but with the broad-band decoupling (WALTZ16 pulse train 42) turned on.

The disclosed MRS techniques are applicable to any animate or inanimate subject. In some applications, the subject is an in vivo subject such as a medical patient, a live veterinary subject, or so forth. In other applications, the subject may be an inanimate subject such as an archaeological mummy, archaeological artifact, or so forth.

This application has described one or more preferred embodiments. Modifications and alterations may occur to others upon reading and understanding the preceding detailed description. It is intended that the application be construed as including all such modifications and alterations insofar as they come within the scope of the appended claims or the equivalents thereof.

The invention claimed is:

1. A method comprising:
    performing, using an MR scanner and an MR controller comprising a digital processing device configured to control the MR scanner, a magnetic resonance (MR) sequence including:
        performing an excitation/localization sub-sequence on a subject to excite $^1H$ polarization localized in a selected spatial region of the subject,
        performing a polarization transfer sub-sequence to transfer localized $^1H$ polarization generated by the excitation/localization sub-sequence to a selected species of non-proton nuclei wherein the polarization transfer sub-sequence includes a pair of phase distortion canceling 180° refocusing pulses operating on the selected species of non-proton nuclei, the pair of phase distortion canceling 180° refocusing pulses comprising trapezoidal refocusing pulses; and
        performing a magnetic resonance spectroscopy (MRS) readout sub-sequence to acquire MRS data for the selected species of non-proton nuclei in the selected spatial region of the subject.

2. The method of claim 1, wherein the selected species of non-proton nuclei is $^{13}C$.

3. The method of claim 1, wherein the subject is an in vivo human or veterinary subject.

4. The method of claim 1, wherein the excitation/localization sub-sequence includes spatial localization by image-selected in vivo spectroscopy (ISIS).

5. The method of claim 1, wherein the polarization transfer sub-sequence employs distortionless enhancement of polarization transfer (DEPT).

6. The method of claim 1, wherein the pair of phase distortion canceling 180° refocusing pulses operating on the selected species of non-proton nuclei comprise Offset Independent Trapezoid (OIT) adiabatic inversion pulses.

7. The method of claim 1, wherein the magnetic resonance (MR) sequence is performed on the subject in a static (B0) magnetic field having a strength of 5 Tesla or higher.

8. The method of claim 1, wherein the magnetic resonance (MR) sequence is performed on the subject in a static (B0) magnetic field having a strength of 7 Tesla or higher.

9. The method of claim 1, wherein the magnetic resonance (MR) sequence further includes performing a decoupling sub-sequence applied concurrently with the readout sub-sequence to decouple $^1H$ polarization from polarization of the selected species of non-proton nuclei.

10. The method of claim 1, further comprising:
generating at least one of (1) a magnetic resonance spectroscopy (MRS) spectrum and (2) a magnetic resonance spectroscopic imaging (MRSI) image from the acquired MRS data for the selected species of non-proton nuclei in the selected spatial region of the subject; and
displaying the MRS spectrum or MRSI image.

11. A method comprising:
performing, using an MR scanner and an MR controller comprising a digital processing device configured to control the MR scanner, a magnetic resonance (MR) sequence including:
performing an excitation/localization sub-sequence on a subject to excite $^1H$ polarization localized in a selected spatial region of the subject,
performing a polarization transfer sub-sequence to transfer localized $^1H$ polarization generated by the excitation/localization sub-sequence to a selected species of non-proton nuclei wherein the polarization transfer sub-sequence includes a pair of phase distortion canceling 180° refocusing pulses operating on the selected species of non-proton nuclei; and
performing a magnetic resonance spectroscopy (MRS) readout sub-sequence to acquire MRS data for the selected species of non-proton nuclei in the selected spatial region of the subject;
wherein the pair of phase distortion canceling 180° refocusing pulses operating on the selected species of non-proton nuclei provides a constant flip angle for the selected species of non-proton nuclei over a band width of at least 10 kHz.

12. A method comprising:
performing, using an MR scanner and an MR controller comprising a digital processing device configured to control the MR scanner, a magnetic resonance (MR) sequence including:
performing an excitation/localization sub-sequence on a subject to excite $^1H$ polarization localized in a selected spatial region of the subject,
performing a polarization transfer sub-sequence to transfer localized $^1H$ polarization generated by the excitation/localization sub-sequence to a selected species of non-proton nuclei wherein the polarization transfer sub-sequence includes a pair of phase distortion canceling 180° refocusing pulses operating on the selected species of non-proton nuclei; and
performing a magnetic resonance spectroscopy (MRS) readout sub-sequence to acquire MRS data for the selected species of non-proton nuclei in the selected spatial region of the subject;
wherein the polarization transfer sub-sequence further includes a pair of phase distortion canceling 180° refocusing pulses operating on $^1H$ nuclei.

13. The method of claim 12, wherein the pair of phase distortion canceling 180° refocusing pulses operating on $^1$nuclei provides a constant flip angle for $^1H$ nuclei over a band width of at least 6 kHz.

14. The method of claim 12, wherein the pair of phase distortion canceling 180° refocusing pulses operating on $^1H$ nuclei comprise trapezoidal refocusing pulses.

15. The method of claim 12, wherein the pair of phase distortion canceling 180° refocusing pulses operating on $^1H$ nuclei comprise Offset Independent Trapezoid (OIT) adiabatic inversion pulses.

16. An apparatus comprising:
a magnetic resonance (MR) scanner generating a static (B0) magnetic field of 5 Tesla or higher; and
an MR controller configured to control the MR scanner to perform an MR sequence including:
performing an excitation/localization sub-sequence on a subject disposed in the static (B0) magnetic field generated by the MR scanner to excite $^1H$ polarization localized in a selected spatial region of the subject,
performing a polarization transfer sub-sequence to transfer localized $^1H$ polarization generated by the excitation/localization sub-sequence to a selected species of non-proton nuclei, the polarization transfer sub-sequence including at least one trapezoidal refocusing pulse operating on the selected species of non-proton nuclei; and
performing a magnetic resonance spectroscopy (MRS) readout sub-sequence to acquire MRS data for the selected species of non-proton nuclei in the selected spatial region of the subject.

17. The apparatus as set forth in claim 16, wherein the MR scanner generates a static (B0) magnetic field of 7 Tesla or higher.

18. The apparatus as set forth in claim 16, wherein the polarization transfer sub-sequence includes a pair of trapezoidal refocusing pulses operating on the selected species of non-proton nuclei.

19. The apparatus as set forth in claim 16, wherein the polarization transfer sub-sequence includes a pair of trapezoidal adiabatic inversion pulses operating on the selected species of non-proton nuclei.

20. A non-transitory storage medium storing instructions executable by a processor to control a magnetic resonance (MR) scanner to perform an MR sequence, the method including:
performing an excitation/localization sub-sequence on a subject to excite $^1H$ polarization localized in a selected spatial region of the subject,
performing a polarization transfer sub-sequence to transfer localized $^1H$ polarization generated by the excitation/localization sub-sequence to a selected species of non-proton nuclei wherein the polarization transfer sub-sequence includes at least one trapezoidal 180° refocusing pulse operating on the selected species of non-proton nuclei, and performing a magnetic resonance spectroscopy (MRS) readout sub-sequence to acquire MRS data for the selected species of non-proton nuclei in the selected spatial region of the subject.

21. The storage medium as set forth in claim 20, wherein the polarization transfer sub-sequence includes a pair of trapezoidal 180° refocusing pulses operating on the selected species of non-proton nuclei.

* * * * *